US006768644B2

(12) United States Patent
Kakinoki et al.

(10) Patent No.: US 6,768,644 B2
(45) Date of Patent: Jul. 27, 2004

(54) COMPACT FLASH CARD

(75) Inventors: Wataru Kakinoki, Yokohama (JP);
Hiroaki Fukuchi, Sagamihara (JP);
Masanori Tsubono, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/121,860

(22) Filed: Apr. 15, 2002

(65) Prior Publication Data

US 2002/0181209 A1 Dec. 5, 2002

(30) Foreign Application Priority Data

May 29, 2001 (JP) .................................... 2001-161039

(51) Int. Cl.[7] .............................................. H05K 7/10
(52) U.S. Cl. ...................................... 361/737; 235/492
(58) Field of Search ............................... 361/737, 752, 361/741, 756, 796; 235/492; 439/638

(56) References Cited

U.S. PATENT DOCUMENTS

| | | | | |
|---|---|---|---|---|
| 5,457,601 A | * | 10/1995 | Georgopulos et al. | ...... 361/686 |
| 5,477,418 A | * | 12/1995 | MacGregor et al. | ........ 361/737 |
| 5,846,092 A | * | 12/1998 | Feldman et al. | ........... 439/76.1 |
| 6,102,715 A | * | 8/2000 | Centofante | ................... 439/140 |
| 6,109,940 A | * | 8/2000 | Chad et al. | ................. 439/141 |
| 6,122,175 A | * | 9/2000 | Shieh | ......................... 361/737 |
| 6,413,108 B2 | * | 7/2002 | Centofante | ................... 439/267 |
| 6,434,010 B1 | * | 8/2002 | Hsu | ........................... 361/737 |
| 6,574,112 B2 | * | 6/2003 | Washino et al. | ............ 361/752 |

* cited by examiner

*Primary Examiner*—David Martin
*Assistant Examiner*—Dameon E. Levi
(74) *Attorney, Agent, or Firm*—Keating & Bennett, LLP

(57) ABSTRACT

A compact flash (CF) card includes, in a front portion, a space-entering portion that enters the space between a top plate and a bottom plate provided on the upper and lower sides of connecting terminal pins arranged at the front end of a CF-card storage section of a PC card adapter. The connecting terminal pins are protected by the top plate and the bottom plate. The CF card storage section of the PC card adapter has an opening in the upper surface on the card insertion side. An upper portion of the CF card that is exposed from the opening includes a tall portion having a greater height than the space-entering portion. The CF card can be loaded in a PC card adapter having a simple structure, and taller electronic components can be mounted in the tall portion, than in a CF card which is equal in height to the space-entering portion over the entire range from the front end to the rear end.

3 Claims, 8 Drawing Sheets

COMPACT FLASH CARD

BACKGROUND OF THE INVENTION

1. Field of the Invention

The present invention relates to a CF (compact flash) card to be loaded into a personal computer, a video camera, and other suitable electronic devices("compact flash" is a registered trademark).

2. Description of the Related Art

CF cards are broadly classified into two types, Type 1 and Type 2. FIG. 5 is an example of a Type-1 CF card 1, and FIG. 6 is an example of a Type-2 CF card 2. The shapes and sizes of such Type-1 and Type-2 CF cards 1 and 2 are determined by a standard. The Type-1 CF card 1 and the Type-2 CF card 2 have completely different thicknesses, and the thickness D2 of the Type-2 CF card 2 is greater than the thickness D1 of the Type-1 CF card 1. The Type-1 and Type-2 CF cards 1 and 2 have substantially equal width W and length L.

A circuit board (not shown) with electronic components mounted thereon is included in such CF cards 1 and 2. A plurality of socket portions 3 and 4 are provided at the front end portion of the CF cards 1 and 2 so as to be electrically connected to the circuit on the built-in circuit board. The socket portions 3 and 4 are arranged in upper and lower rows. The heights h1 and h2 of the upper and lower rows from bottom surface B1 and B2 are equal to each other.

Such CF cards 1 and 2 can be used as PC cards by loading them in a PC card adapter. FIG. 4A is a schematic plan view of an example of a PC card adapter 6, and FIG. 4B is a schematic sectional view of the PC card adapter 6, taken along line A—A in FIG. 4A.

The PC card adapter 6 is shaped like a card, and has a CF-card storage section 7. An opening 7a is provided at the rear end portion of the CF-card storage section 7 to define a CF-card insertion slot. An opening 7b is also provided in the upper surface of the CF-card storage section 7 on the card insertion side.

A plurality of connecting terminal pins 8 protrude from a front end surface 7c of the CF-card storage section 7. The connecting terminal pins 8 are arranged corresponding to the rows of the socket portions 3 of the CF card 1, and are fitted in the socket portions so as to electrically connect the circuit of the CF card 1 and the circuit of the PC card adapter 6.

Top and bottom plates 10 and 11 are provided on the upper and lower sides of the connecting terminal pins 8 at a distance therefrom so as to protect the connecting terminal pins 8 from being damaged.

In order to load the CF card 1 into such a PC-card adapter 6, for example, the front end portion of the CF card 1 (that is, a portion where the socket portions 3 are provided) is inserted into the rear opening 7a of the CF-card storage section 7 of the PC card adapter 6, and the CF card 1 is slid into the CF-card storage section 7. Consequently, the front end portion of the CF card 1 enters the space 12 between the top plate 10 and the bottom plate 11 disposed on the upper and lower sides of the connecting terminal pins 8, and the socket portions 3 at the front end portion of the CF card 1 are fitted to the connecting terminal pins 8 of the PC card adapter 6, such that the CF card 1 is placed inside the CF-card storage section 7 with its upper surface exposed. In this way, the CF card 1 is loaded in the PC card adapter 6.

The shape and size of the PC card adapter 6 are determined by a standard, and the thickness d of the PC card adapter 6 is substantially equal to the thickness D2 of the Type-2 CF card 2. For this reason, the distance between the top plate 10 and the bottom plate 11 in the PC card adapter 6 is less than the thickness D2 of the Type-2 CF card 2, and the front end portion of the Type 2 CF card 2 cannot enter the space 12 between the top plate 10 and the bottom plate 11. Consequently, the Type-2 CF card 2 cannot be loaded in the PC card adapter 6 shown in FIG. 4. That is, the PC card adapter 6 is used exclusively for the Type-1 CF card 1.

Accordingly, a PC card adapter has been proposed in which not only a Type-1 CF card 1 but also a Type-2 CF card 2 can be loaded. In this adapter, since the connecting terminal pins 8 are not protected by the top plate 10 and the bottom plate 11 when the Type-2 CF card 2 is loaded, the PC card adapter for both Type-1 and Type-2 is provided with a special mechanism for protecting the connecting terminal pins 8.

For example, in a PC card adapter 14 shown in FIG. 7A, a CF-card storage section 15 is open at the upper and lower sides, and is also open at the rear end portion so as to define a card insertion portion. A plurality of connecting terminal pins 16 are arranged at the front end portion of the CF-card storage section 15, and a pin-protecting cover 17 is provided to protect the connecting terminal pins 16. The PC card adapter 14 has a mechanism that retracts the pin-protecting cover 17 and exposes the connecting terminal pins 16 when a CF card 2 (1) is slid into the CF-card storage section 15, as shown in FIG. 7B. The CF card 1 or 2 can be loaded in the PC card adapter 14 by exposing the connecting terminal pins 16 with the mechanism.

In a manner similar to that in the above-described PC card adapter 14, in a PC card adapter 20 shown in FIGS. 8A and 8B, a CF-card storage section 21 is open at the upper and lower sides and is also open at the rear end portion to define a card insertion portion, a plurality of connecting terminal pins 23 are arranged at the front end portion of the CF-card storage section 21, and a pin-protecting cover 22 is provided to protect the connecting terminal pins 23. In the PC card adapter 20, the pin-protecting cover 22 is retracted and the connecting terminal pins 23 are exposed by operating an operating portion 22a. As a result, the CF card 1 or 2 can be loaded into the PC card adapter 20.

Some Type-1 and Type-2 CF cards have a so-called extended shape, as shown in the side view of FIG. 3. An extended type CF card 1' or 2' is provided with an extended portion 25 that protrudes rearward from the CF-card storage section 7, 15, or 21 when the CF card 1' or 2' is loaded in the PC card adapter 6, 14, or 20. Since the size of the extended portion 25 is not limited by a standard, the extended portion 25 can be made thicker (taller) than other portions such that taller electronic components can be provided therein.

Since the Type-2 CF card 2 is thicker (in other words, taller) than the Type-1 CF card 1, taller electronic components can be mounted on the internal circuit board than in the Type-1 CF card 1. For this reason, in the extended Type-2 CF card 2', the size of the extended portion 25 is reduced, and thus the size of the CF card is reduced.

However, such a Type-2 CF-card 2 or 2' can be used as a PC card only when used with the above-described PC card adapter 14 or 20 having a complicated mechanism. Since the PC card adapter 14 or 20 has a complicated mechanism, these PC card adapters 14 and 20 are expensive and failure-prone.

SUMMARY OF THE INVENTION

In order to overcome the problems described above, preferred embodiments of the present invention provide a CF card that can be loaded in a PC card adapter for a Type-1 CF card having a simplified structure and that can incorporate therein taller electronic components than the Type-1 CF card.

A preferred embodiment of the present invention provides a CF card to be loaded in a PC card adapter in which an upper surface on a card insertion side of a CF-card storage section has an opening from which the card is exposed, and a connecting terminal pin disposed at the front end portion of the CF-card storage section is protected by a top plate and a bottom plate provided on the upper and lower sides at a distance from the connecting terminal pin, wherein a front portion of the CF card having a socket portion to be fitted to the connecting terminal pin of the PC card adapter defines a space-entering portion that enters the space between the top plate and the bottom plate on the upper and lower sides of the connecting terminal pin of the PC card adapter, an upper portion of the CF card exposed from the upper opening of the CF-card storage section of the PC card adapter has an increased height portion having a greater height than the space-entering portion, and the upper surface of the increased height portion is substantially flush with the upper surface of the PC card adapter when the CF card is placed in the CF-card storage section of the PC card adapter.

Preferably, the CF card is an extended type including an extended portion that protrudes rearward from the PC card adapter when it is loaded in the PC card adapter.

Preferably, the extended portion includes a tall portion which protrudes upward from the upper surface of the PC card adapter when the CF card is loaded in the PC card adapter.

When the CF card of the preferred embodiment of the present invention is loaded in the PC card adapter in which the connecting terminal pins are protected by the top and bottom plates (that is, the PC card adapter for a Type-1 CF card), the space-entering portion at the front side of the CF card is inserted and placed in the space between the top plate and the bottom plate disposed on the upper and lower sides of the connecting terminal pins of the PC card adapter, and the socket portions provided in the space-entering portion are fitted to the connecting terminal pins of the PC card adapter. The upper surface of the tall portion of the CF card is exposed from the upper opening of the CF-card storage section, and is substantially flush with the upper surface of the PC card adapter.

Since the front portion of the CF card has the space-entering portion that enters the space between the top plate and the bottom plate disposed on the upper and lower sides of the connecting terminal pins of the PC card adapter, the CF card can be used as a PC card by being loaded in a PC card adapter in which the connecting terminal pins are protected by the top and bottom plates (that is, a PC card adapter for a Type-1 CF card). For this reason, it is unnecessary to use a PC card adapter that has a complicated mechanism and is thereby expensive and failure-prone (that is, a PC card adapter for both Type-1 and Type-2 CF cards).

Since the upper portion of the CF card exposed from the upper opening of the CF-card storage section of the PC card adapter has an increased height portion having a greater height than the space-entering portion, tall electronic components can be mounted on a circuit board inside the tall portion. This increases the mounting density of components on the circuit board. Moreover, the CF card is easily loaded in the PC card adapter for a Type-1 CF card. This makes it possible to enhance the performance and to increase the functionality.

Since the mounting density of components on the circuit board is increased, the size of the extended portion is reduced, and the size of the CF card can also be reduced.

In the preferred embodiment of the present invention having a tall portion which protrudes upward from the upper surface of the PC card adapter when the CF card is loaded in the PC card adapter, taller electronic components can be mounted thereon, and therefore, a CF card that is superior in performance and function is provided.

Further objects, features and advantages of the present invention will become apparent from the following description of the preferred embodiments with reference to the attached drawings.

DETAILED DESCRIPTION OF PREFERRED EMBODIMENTS

A preferred embodiment of the present invention will be described below with reference to the attached drawings.

Figure 1A:
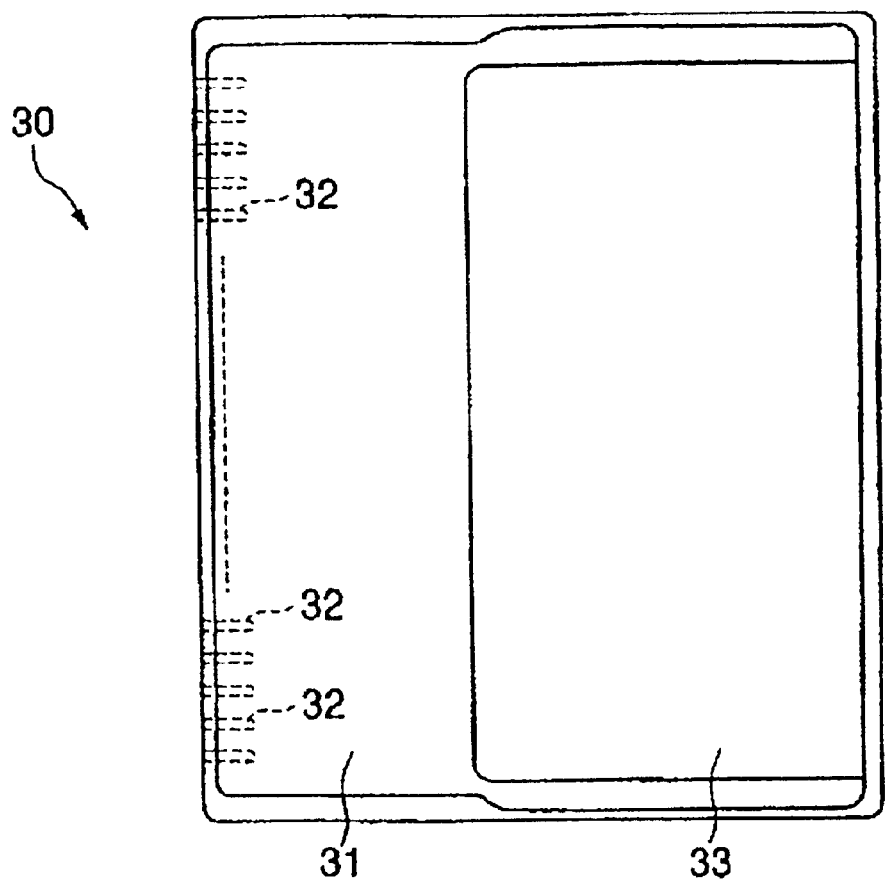
FIGS. 1A and 1B are model views of a CF card according to a preferred embodiment of the present invention.
Figure 1B:
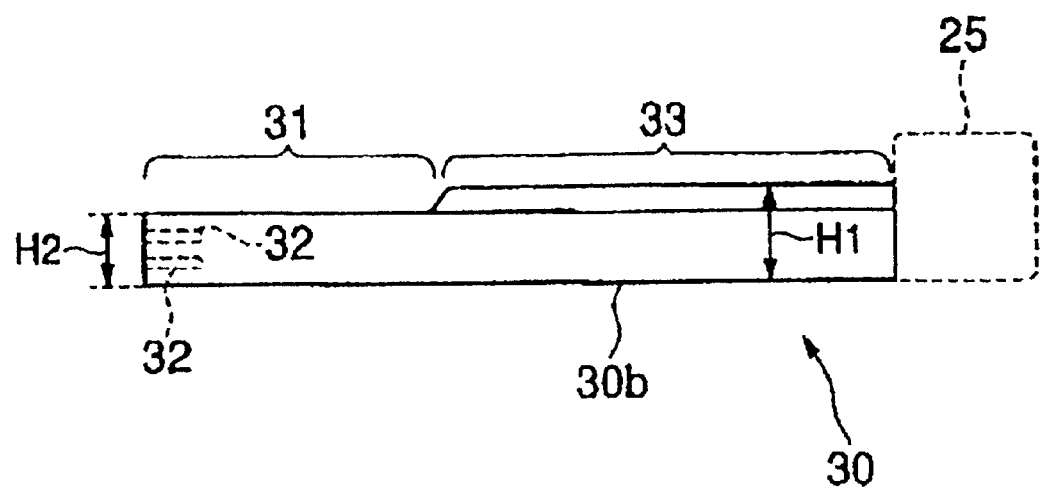

FIGS. 1A and 1B are a plan view and a schematic side view, respectively, of a CF card according to a preferred embodiment of the present invention. In the following description of this preferred embodiment, the same components as those in the CF card and the PC card adapter described above as the related arts are denoted by the same reference numerals, and repetitive descriptions thereof are omitted.

Figure 4A:
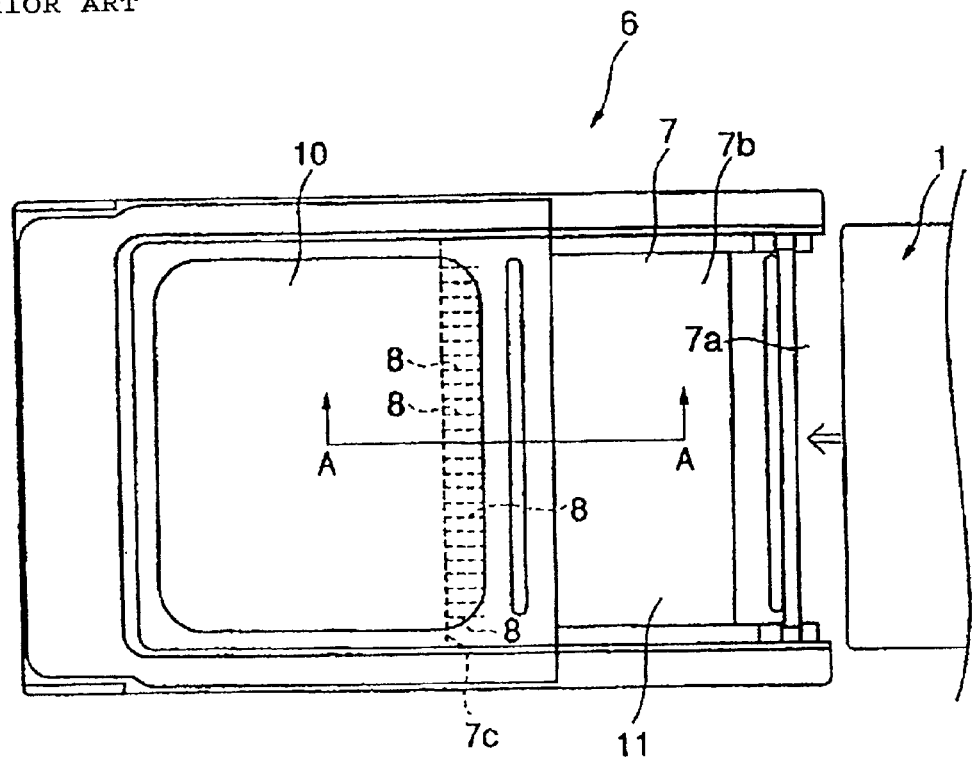
FIGS. 4A and 4B are model views showing an example of a PC card adapter for a Type-1 CF card.
Figure 4B:
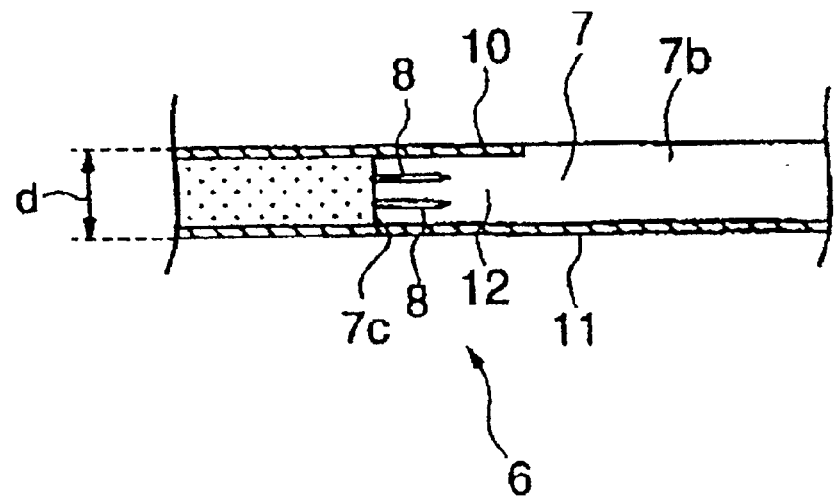
Figure 5:
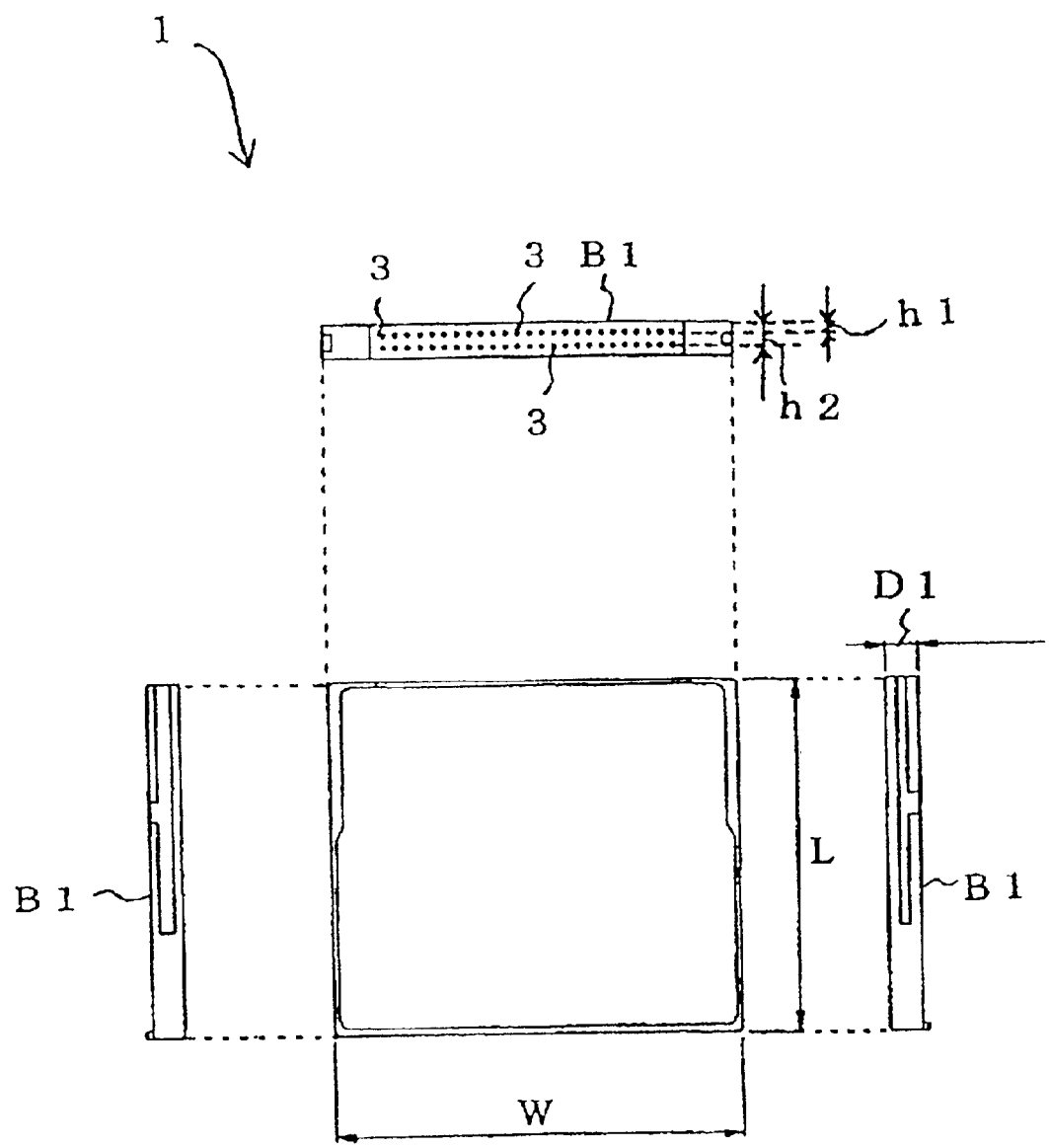
FIG. 5 is a model view of an example of a Type-1 CF card.
Figure 6:
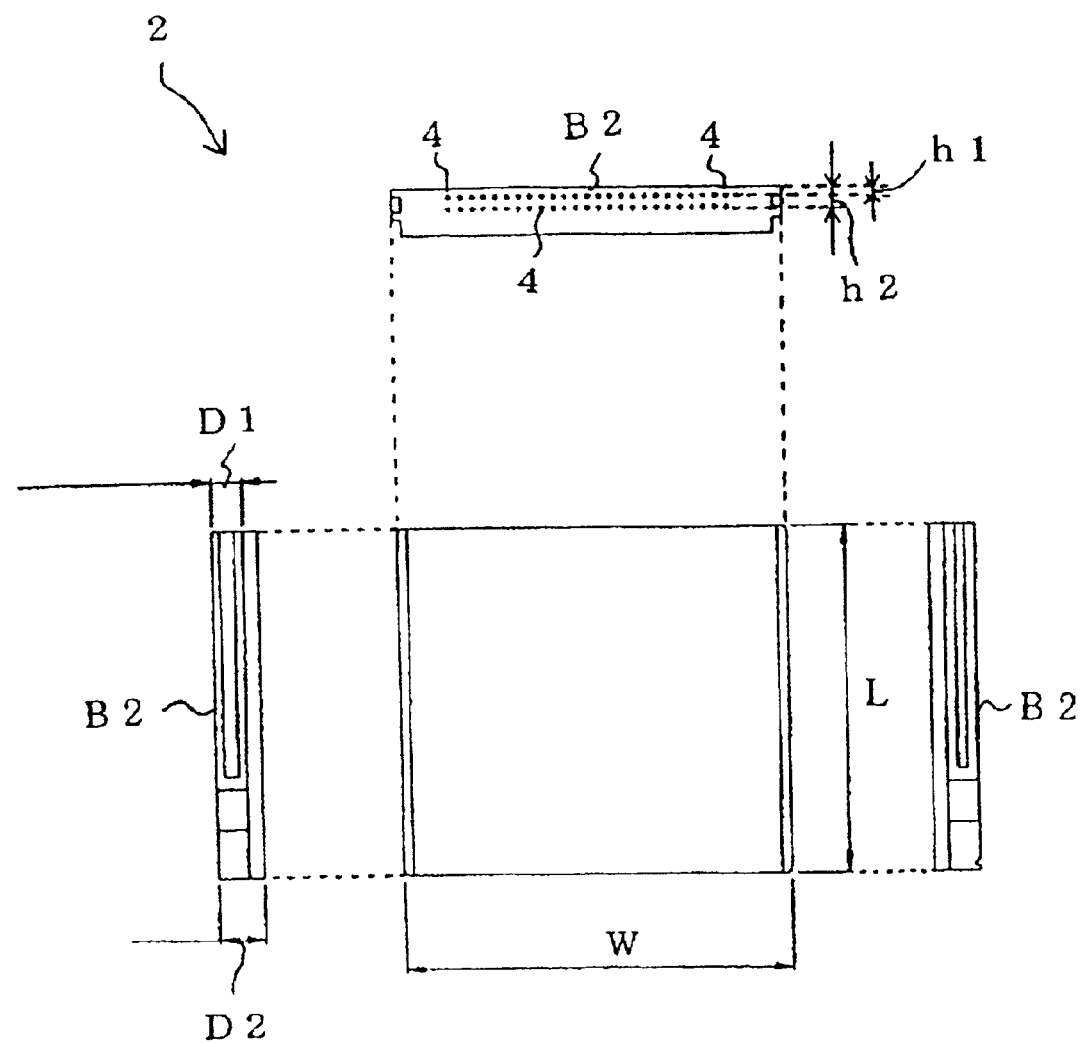
FIG. 6 is a model view of an example of a Type-2 CF card.
Figure 7A:
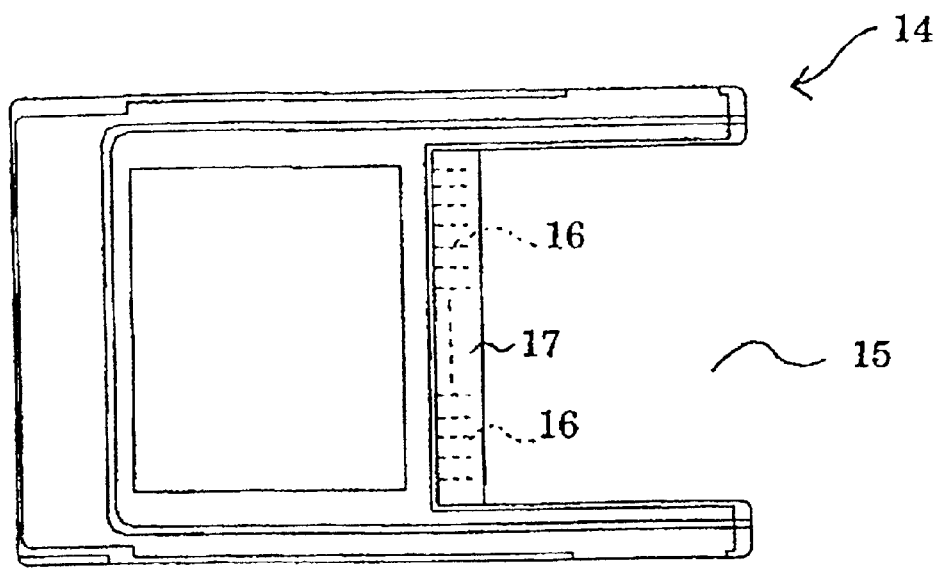
FIGS. 7A and 7B are explanatory views showing an example of a PC card adapter for both Type-1 and Type-2 CF cards.
Figure 7B:
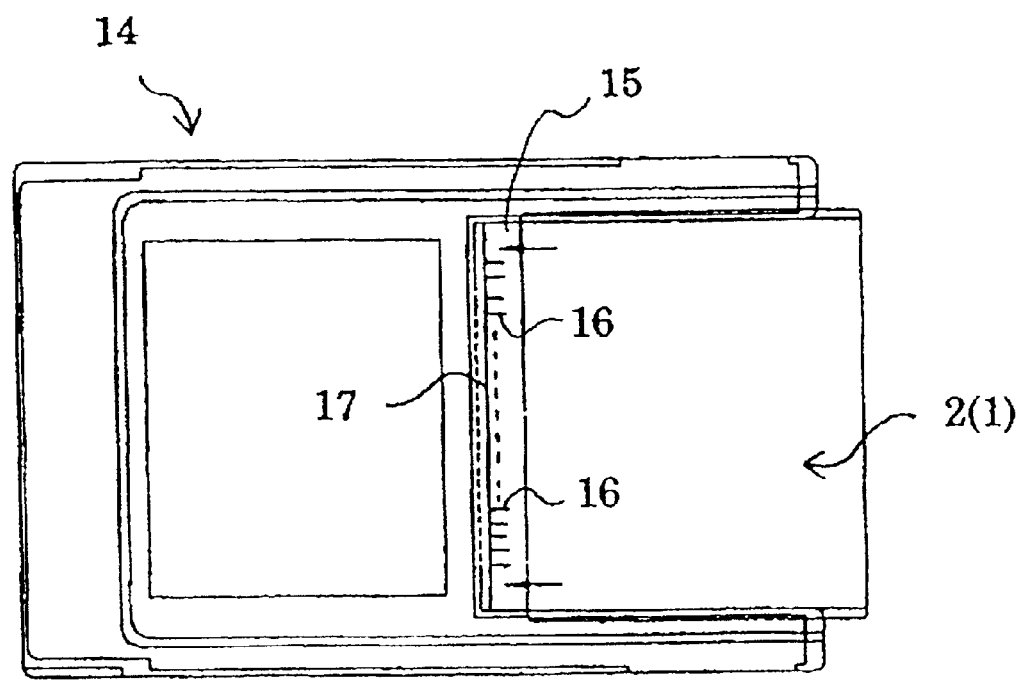
Figure 8A:
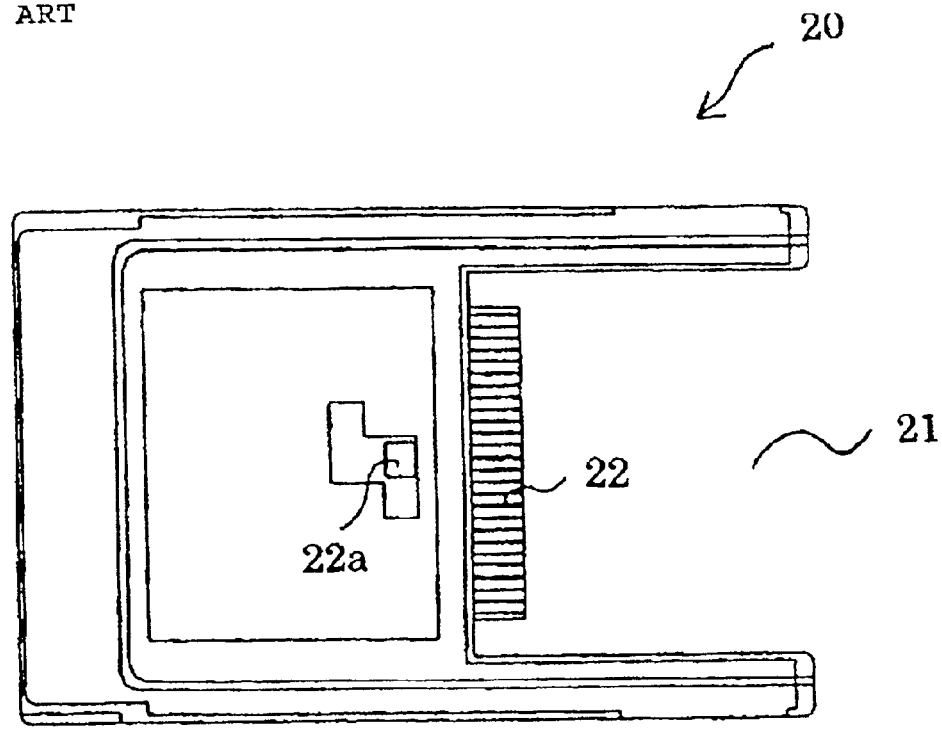
FIGS. 8A and 8B are explanatory views showing another example of a PC card adapter for both Type-1 and Type-2 CF cards.
Figure 8B:
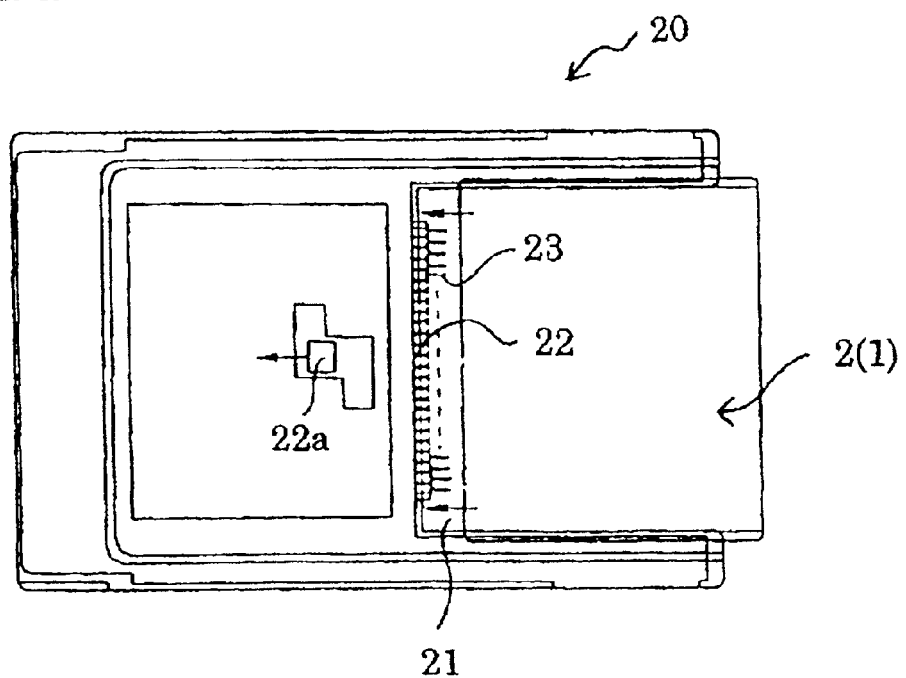

A CF card 30 of this preferred embodiment can be loaded into PC card adapters 14 and 20 for both Type-1 and Type-2 CF cards shown in FIGS. 7 and 8, and also loaded into a PC card adapter 6 for Type 1 CF cards shown in FIG. 4. Moreover, the CF card 30 has an internal capacity that is greater than that of the Type-1 CF card 1.

Figure 2A:
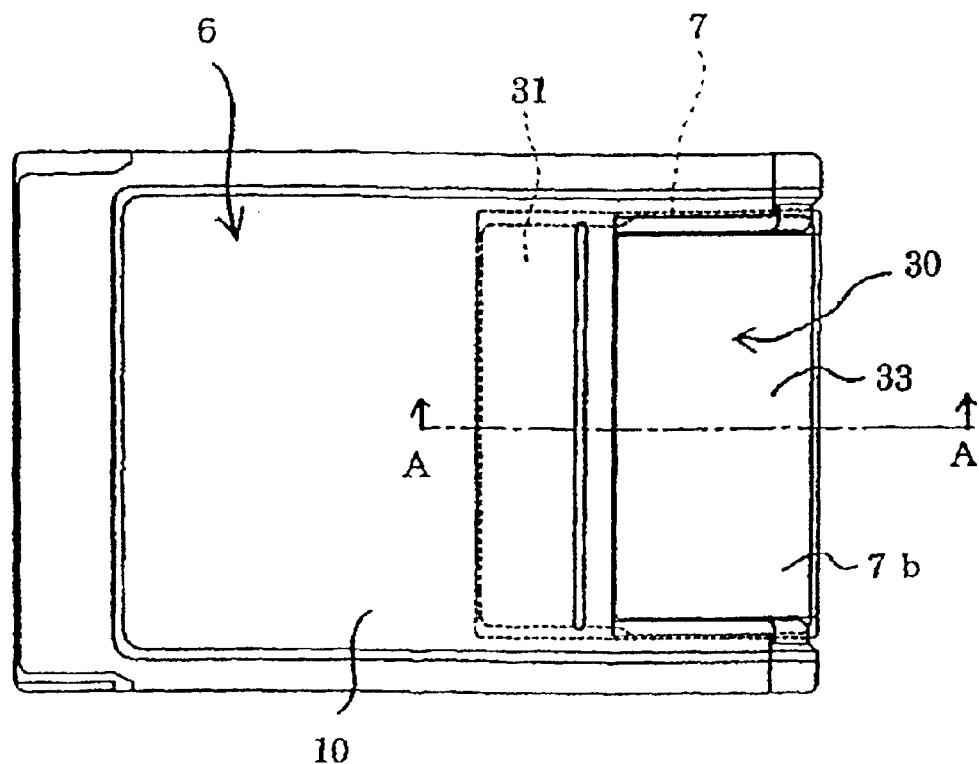
FIGS. 2A and 2B are model views showing an example of a state in which the CF card shown in FIGS. 1A and 1B is loaded in a PC card adapter for a Type-1 CF card.
Figure 2B:
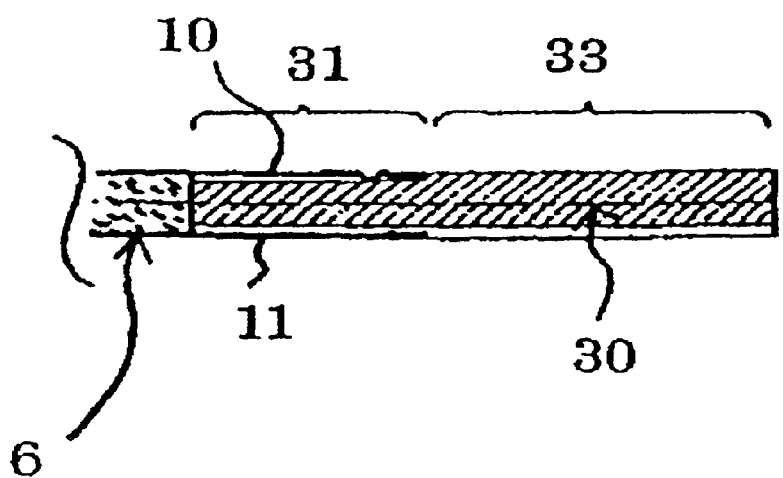
Figure 3:
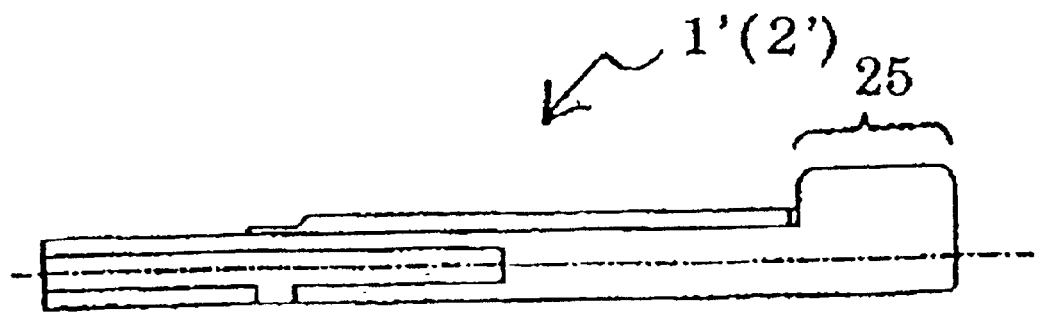
FIG. 3 is a schematic side view of an extended type CF card.

FIG. 2A is a plan view showing the CF card 30 of this preferred embodiment loaded in the PC card adapter 6 for Type 1. FIG. 2B is a schematic sectional view, taken along line A—A in FIG. 2A.

The height H2 of a front portion 31 of the CF card 30 from a bottom surface 30b is less than the height of a space 12 between top and bottom plates 10 and 11 provided on the upper and lower sides of connecting terminal pins 8 of the PC card adapter 6. The front portion 31 defines a space-entering portion that enters the space 12. A plurality of socket portions 32 are provided at the front end portion of the space-entering portion 31 such that the socket portions 32 are fitted to the connecting terminal pins 8 of the PC card adapter 6.

A CF-card storage section 7 of the PC card adapter 6 has an opening 7b on the upper side and card-insertion side from which the CF card 30 is exposed. The height H1 from the bottom surface 30b of a tall portion 33 of the CF card 30 exposed from the opening 7b is greater than the height H2 of the space-entering portion 31. When the CF card 30 is loaded in the PC card adapter 6, the upper surface of the tall portion 33 is substantially flush with the upper surface of the PC card adapter 6.

The CF card 30 according to this preferred embodiment can be loaded into the PC card adapter 6 in a same manner in a case in which the Type-1 CF card is loaded.

Since the CF card 30 has the space-entering portion 31, it can be loaded not only into the PC card adapters 14 and 20 for both Type 1 and Type 2, but also into the PC card adapter 6 for Type 1. In other words, the CF card 30 can be used as a PC card with the PC card adapter 6 for Type 1, instead of the PC card adapters 14 and 20 for both Type 1 and Type 2 that are expensive and failure-prone.

Further, since the CF card 30 has the tall portion 33, taller electronic components can be mounted in the tall portion 33 than in the Type-1 CF card 1 which is equal in height to the space-entering portion 31 over the entire length from the front end to the rear end. This increases the mounting density on a circuit board in the CF card 30, and allows the CF card 30 to include a hard disk incorporated therein even when the CF card 30 is loaded in the PC card adapter for Type 1. Moreover, the functions as an I/O card are greatly improved.

The present invention is not limited to the preferred embodiment described above, and various modifications are possible. For example, the present invention is also applicable to an extended type CF card. The extended type CF card has an extended portion 25 that protrudes from a back end surface of the PC card adapter in a state in which the CF card is loaded in the PC card adapter, as shown by a dotted line in FIG. 1B.

The extended portion 25 may also protrude upward from the upper surface of the PC card adapter in a state in which the CF card is loaded in the PC card adapter, as shown in FIG. 1B, or the upper surface of the extended portion 25 may be substantially flush with the upper surface of the PC card adapter. Alternatively, the upper surface of the extended portion 25 may be recessed from the upper surface of the PC card adapter.

While the entire upper portion of the CF card 30 exposed from the opening 7b of the CF card storage section 7 of the PC card adapter 6 is tall in the preferred embodiment described above, the exposed portion need not always be tall. For example, only a portion of the exposed portion, such as a center portion or a rear portion, may be tall.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A memory card system comprising:
    a PC card adapter including a memory-card storage section having an opening in an upper card-insertion side thereof, a connecting terminal pin disposed at a front end portion of said memory-card storage section, and a top plate and a bottom plate provided on upper and lower sides of said connecting terminal pin at a distance from said connecting terminal pin; and
    a memory card comprising:
        a front portion including a socket portion to be fitted to said connecting terminal pin of said PC card adapter, said front portion defining a space-entering portion to enter the space between said top plate and said bottom plate on the upper and lower sides of said connecting terminal pin of said PC card adapter;
        an upper portion to be exposed from an opening of said memory-card storage section of said PC card adapter arid including a tall portion having a greater height than said space-entering portion; wherein
        an upper surface of said tall portion is substantially flush with the upper surface of said PC card adapter when said memory card is placed in said memory-card storage section of said PC card adapter.

2. A memory card according to claim 1, wherein said memory card is an extended type including an extended portion that protrudes rearward from said PC card adapter when it is loaded in said PC card adapter.

3. A memory card according to claim 2, wherein said extended portion defines a tall portion which protrudes upward from the upper surface of said PC card adapter when said memory card is loaded in said PC card adapter.

* * * * *